(12) United States Patent  
Aoki

(10) Patent No.: US 11,516,418 B2  
(45) Date of Patent: Nov. 29, 2022

(54) SOLID-STATE IMAGING APPARATUS

(71) Applicant: SONY SEMICONDUCTOR SOLUTIONS CORPORATION, Kanagawa (JP)

(72) Inventor: Takeshi Aoki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/286,042

(22) PCT Filed: Oct. 9, 2019

(86) PCT No.: PCT/JP2019/039743  
§ 371 (c)(1),  
(2) Date: Apr. 16, 2021

(87) PCT Pub. No.: WO2020/085085  
PCT Pub. Date: Apr. 30, 2020

(65) Prior Publication Data  
US 2021/0385397 A1 Dec. 9, 2021

(30) Foreign Application Priority Data  
Oct. 23, 2018 (JP) .............................. JP2018-199328

(51) Int. Cl.  
*H01L 27/146* (2006.01)  
*H04N 5/353* (2011.01)  
(Continued)

(52) U.S. Cl.  
CPC ....... *H04N 5/363* (2013.01); *H01L 27/14614* (2013.01); *H04N 5/353* (2013.01); *H04N 5/378* (2013.01); *H04N 5/3765* (2013.01)

(58) Field of Classification Search  
CPC .............. H01L 27/14614; H04N 5/353; H04N 5/3765; H04N 5/378  
See application file for complete search history.

(56) References Cited

U.S. PATENT DOCUMENTS

2010/0013975 A1  1/2010  Nakashima et al.  
2010/0259659 A1* 10/2010  Suzuki ................ H04N 5/3741  
                                                   348/E5.091

(Continued)

FOREIGN PATENT DOCUMENTS

JP    2006-253316 A    9/2006  
JP    2010-027668 A    2/2010  
(Continued)

OTHER PUBLICATIONS

International Search Report and Written Opinion of PCT Application No. PCT/JP2019/039743, dated Dec. 10, 2019, 12 pages of ISRWO.

*Primary Examiner* — Ahmed A Berhan  
(74) *Attorney, Agent, or Firm* — Chip Law Group

(57) ABSTRACT

A solid-state imaging apparatus according to an embodiment of the present disclosure includes a photoelectric transducer, a transfer transistor, a floating diffusion, a reset transistor, an amplifier transistor, and a selection transistor. The reset transistor includes a gate insulating film formed thinner than the gate insulating film of the transfer transistor.

11 Claims, 9 Drawing Sheets

(51) Int. Cl.
*H04N 5/376* (2011.01)
*H04N 5/378* (2011.01)
*H04N 5/363* (2011.01)

(56) References Cited

U.S. PATENT DOCUMENTS

| | | |
|---|---|---|
| 2011/0234836 A1 | 9/2011 | Machida |
| 2011/0267505 A1 | 11/2011 | Dierickx |
| 2014/0327059 A1 | 11/2014 | Ammo |
| 2016/0028986 A1* | 1/2016 | Kobayashi ........ H01L 27/14643 348/307 |

FOREIGN PATENT DOCUMENTS

| | | | |
|---|---|---|---|
| JP | 2010-212714 A | 9/2010 | |
| JP | 2011-204878 A | 10/2011 | |
| JP | 2011-234366 A | 11/2011 | |
| JP | 2015-111604 A | 6/2015 | |
| JP | 2016-063142 A | 4/2016 | |
| JP | 2017-163087 A | 9/2017 | |
| KR | 20050029230 A * | 3/2005 | ....... H01L 27/14689 |
| WO | 2013/094430 A1 | 6/2013 | |
| WO | 2013/150839 A1 | 10/2013 | |

\* cited by examiner

[FIG. 1]
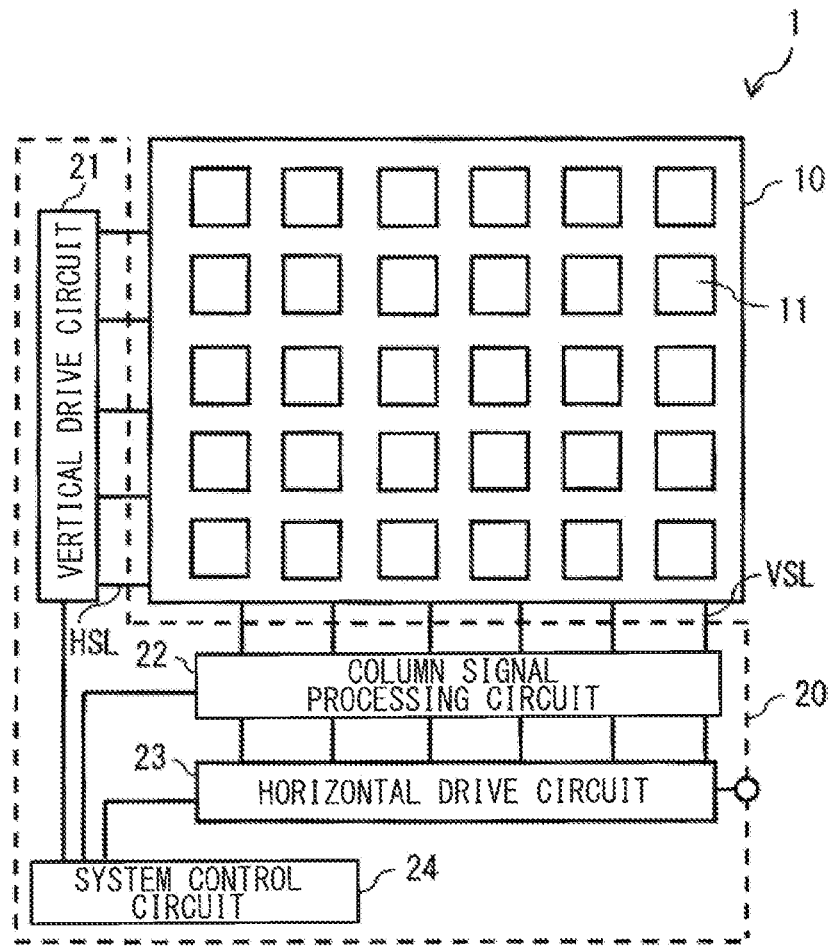
[FIG. 2]
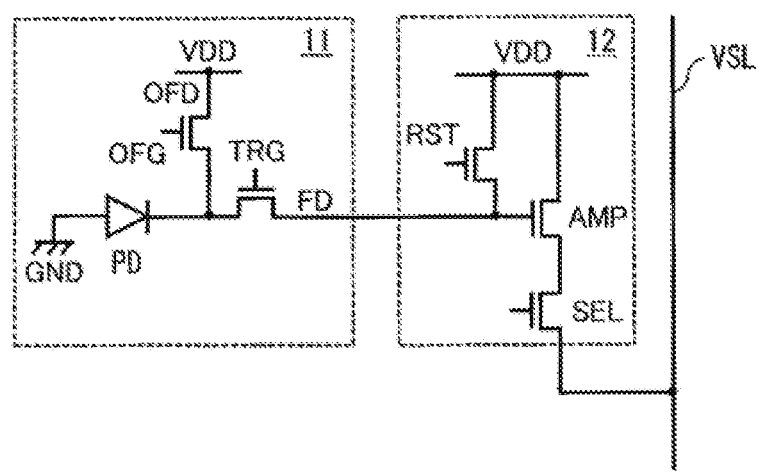

[FIG. 3]
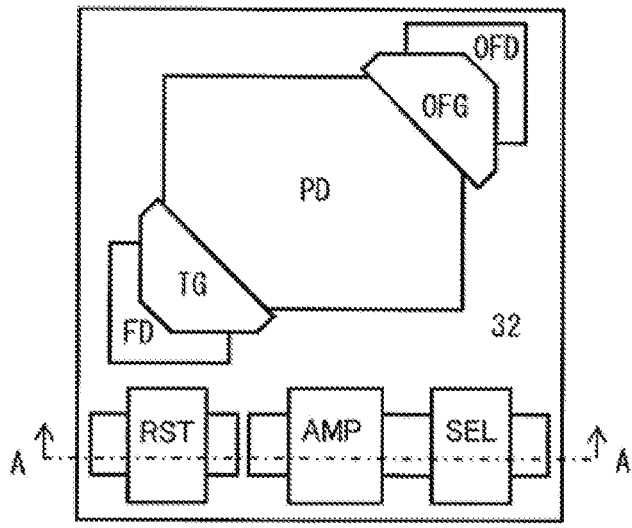
[FIG. 4]
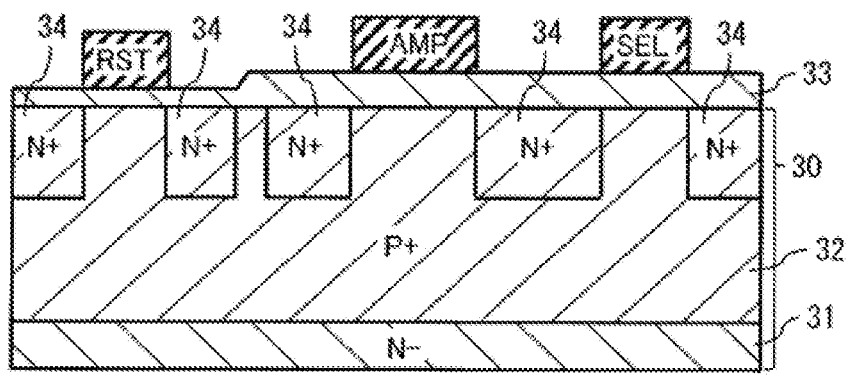
[FIG. 5]
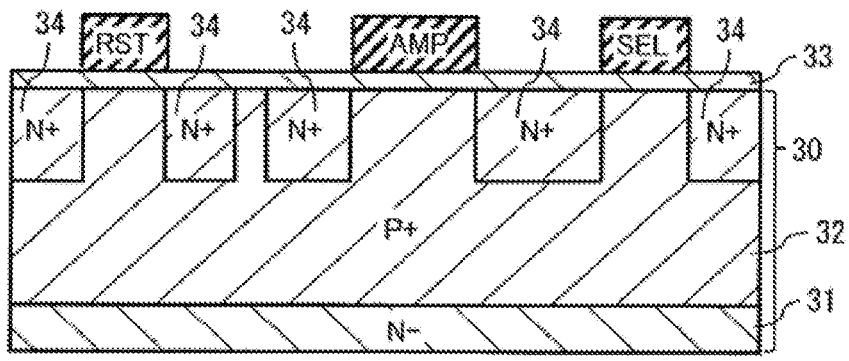

[FIG. 6]
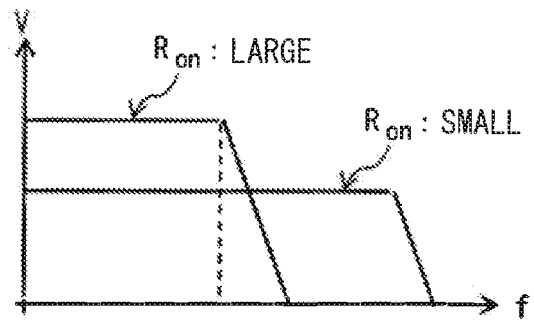
[FIG. 7]
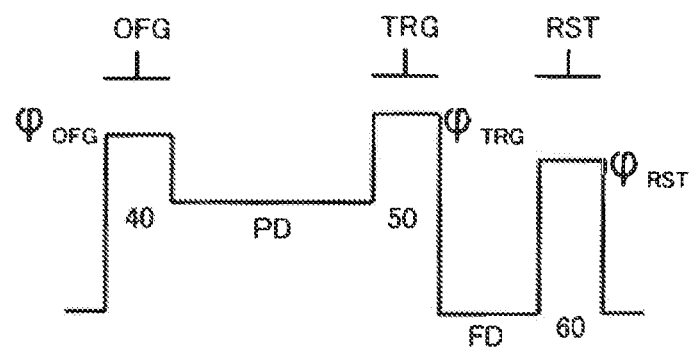
[FIG. 8A]
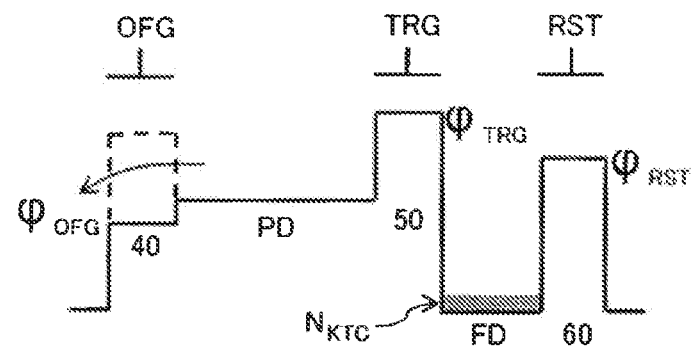
[FIG. 8B]
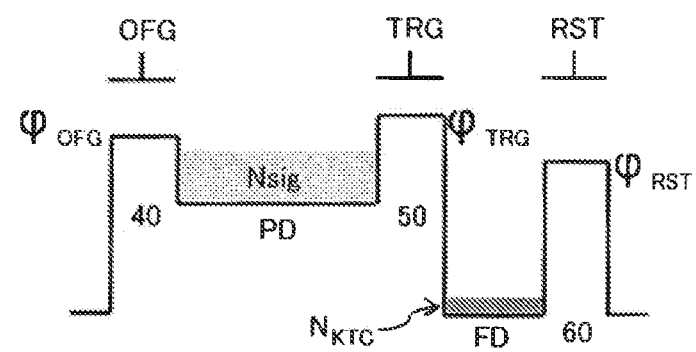

[FIG. 8C]
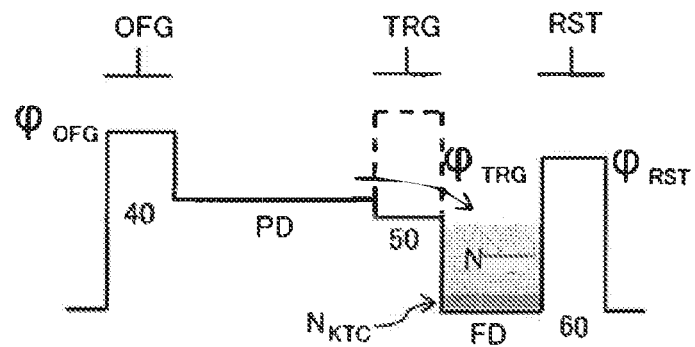
[FIG. 8D]
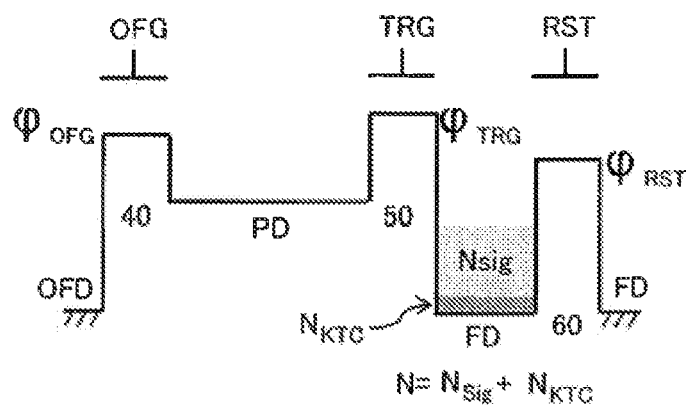
[FIG. 8E]
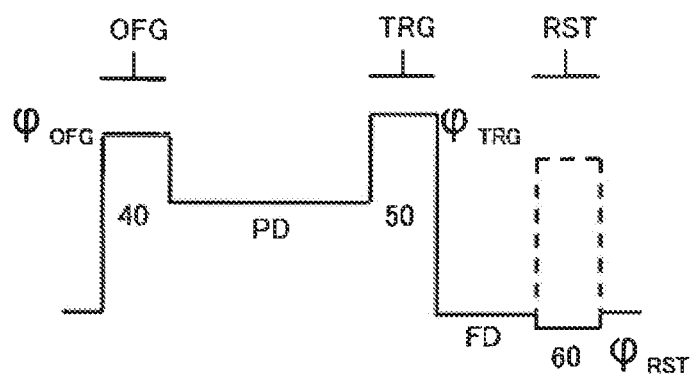

[ FIG. 8F ]
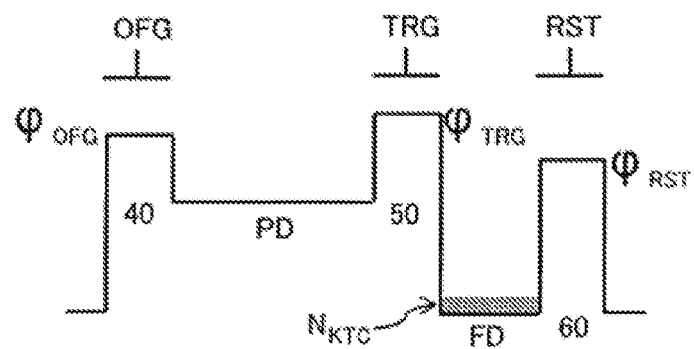
[ FIG. 9 ]
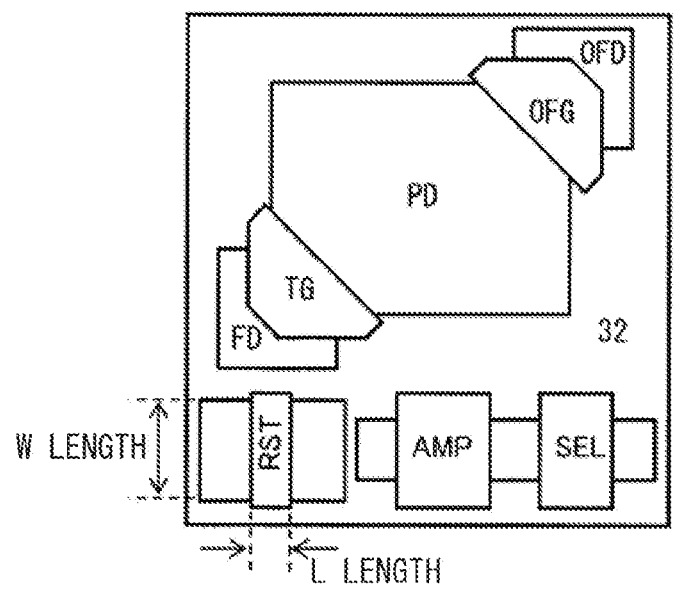

[ FIG. 10 ]
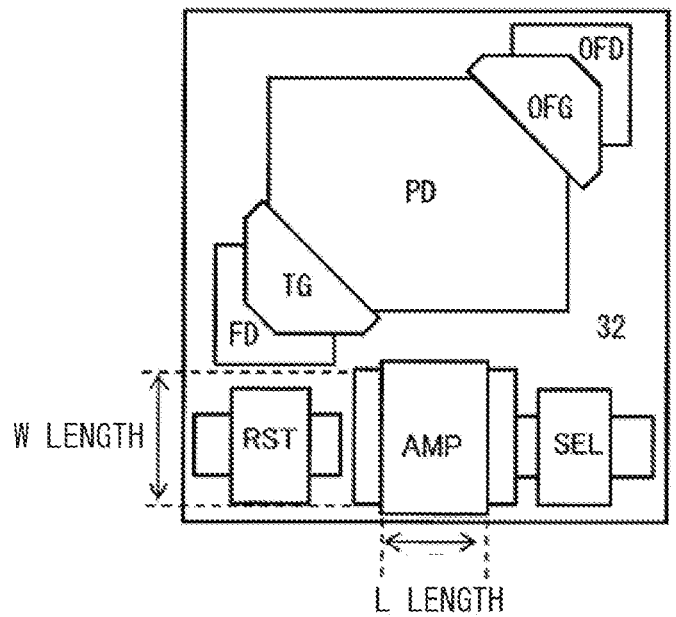
[ FIG. 11 ]
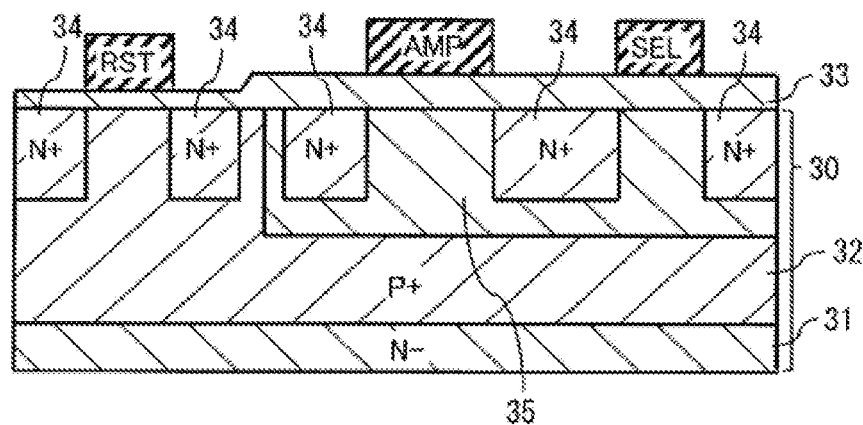
[ FIG. 12 ]
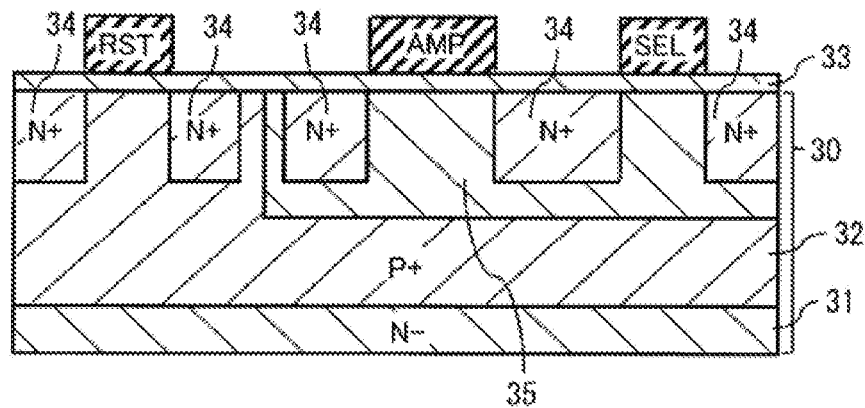

[FIG. 13]
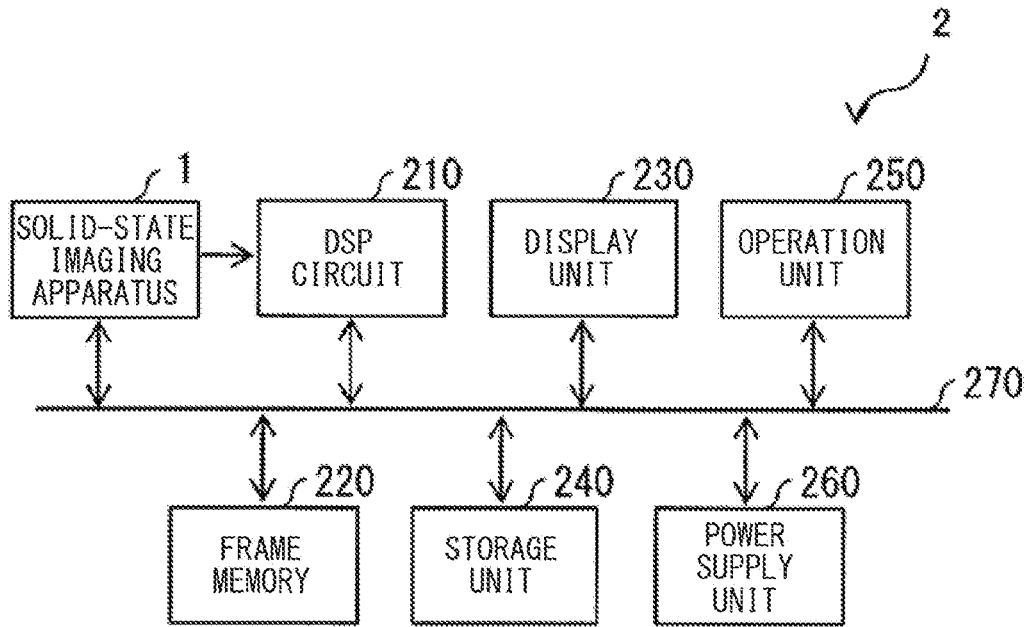
[FIG. 14]
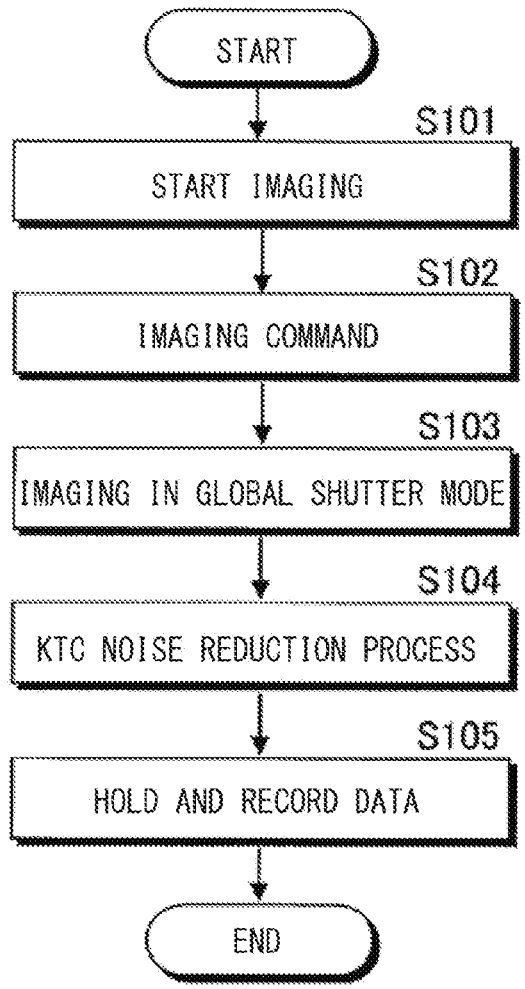

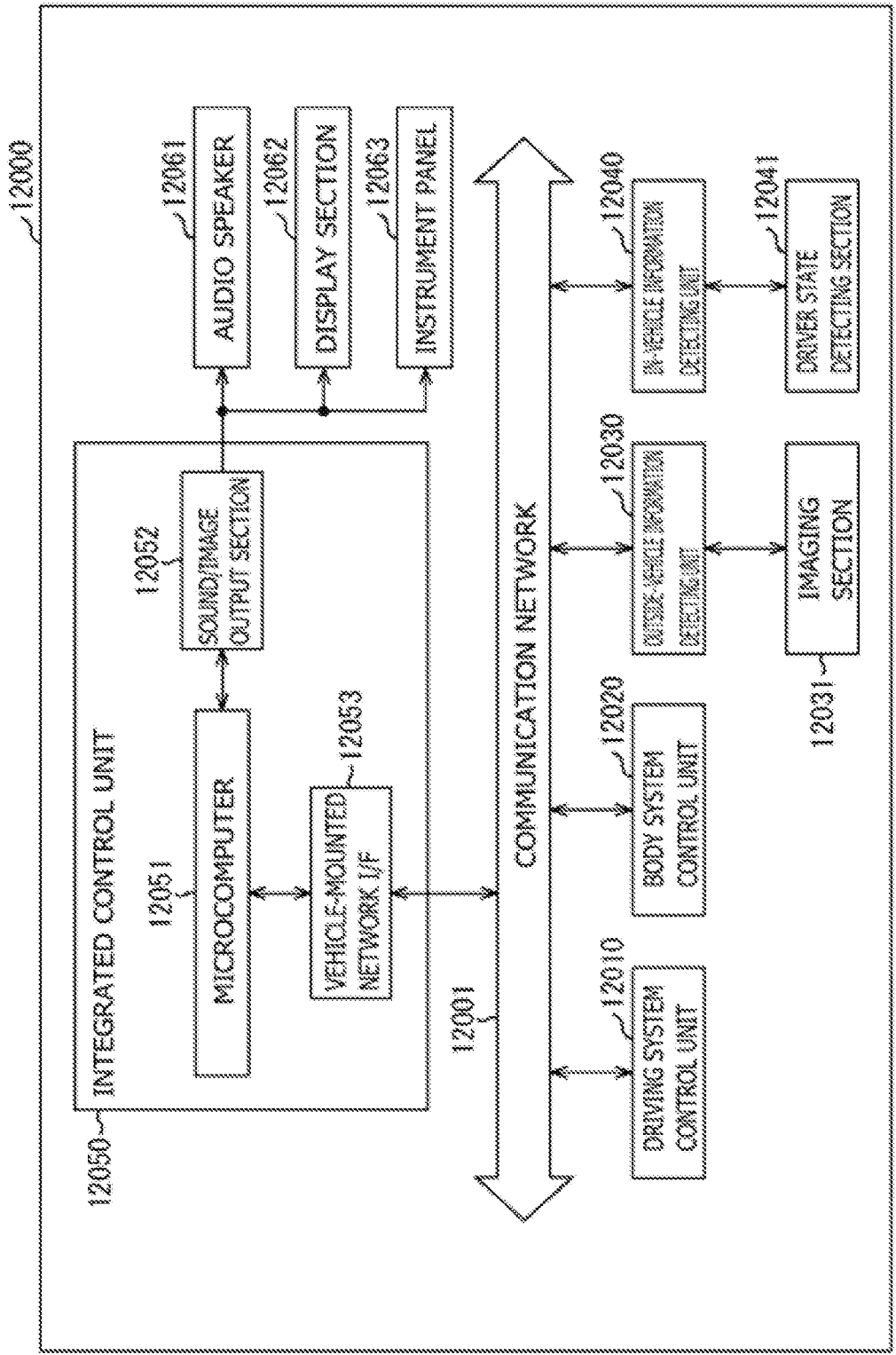
[FIG. 15]

[ FIG. 16 ]
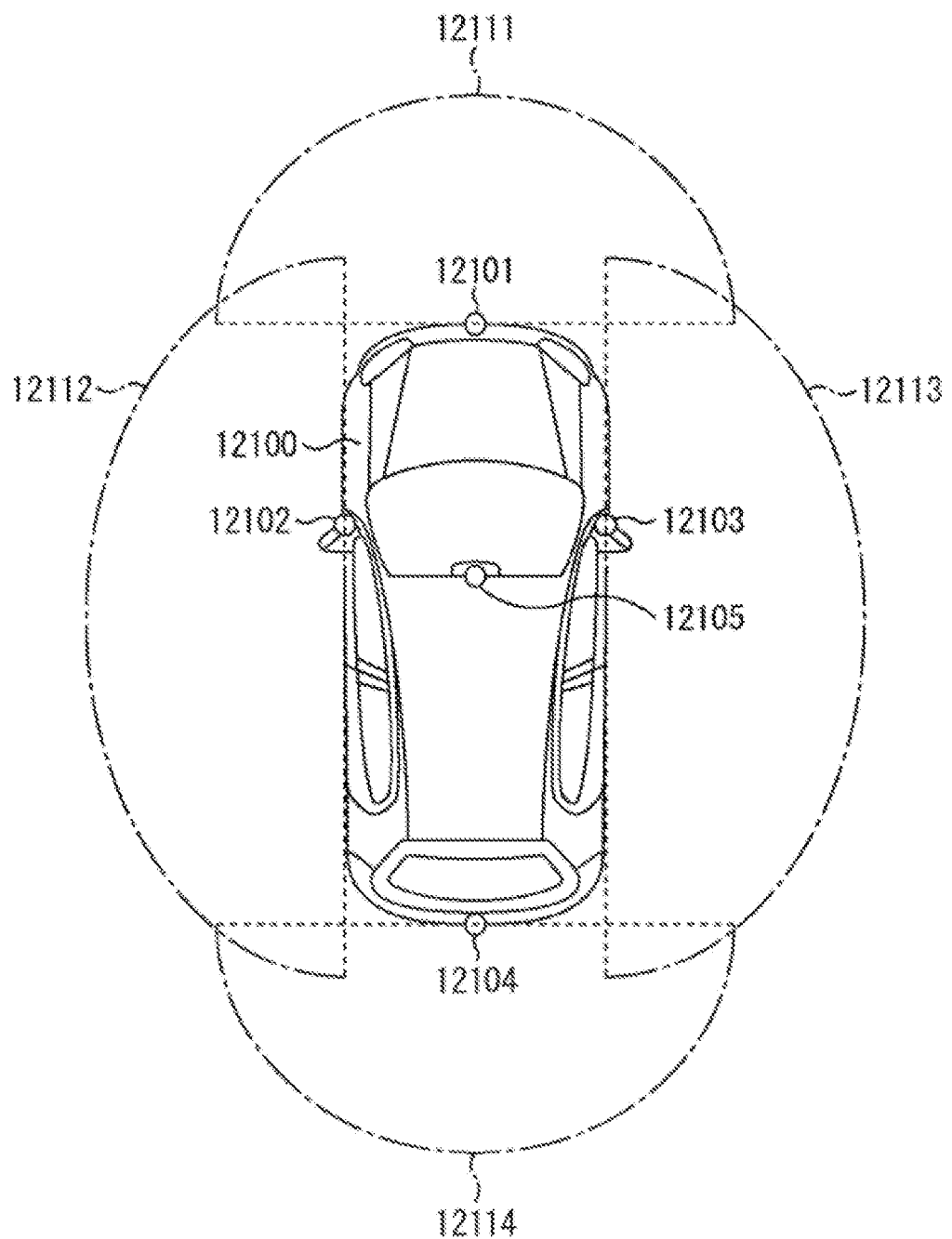

SOLID-STATE IMAGING APPARATUS

CROSS REFERENCE TO RELATED APPLICATIONS

This application is a U.S. National Phase of International Patent Application No. PCT/JP2019/039743 filed on Oct. 9, 2019, which claims priority benefit of Japanese Patent Application No. JP 2018-199328 filed in the Japan Patent Office on Oct. 23, 2018. Each of the above-referenced applications is hereby incorporated herein by reference in its entirety.

TECHNICAL FIELD

The present disclosure relates to a solid-state imaging apparatus.

BACKGROUND ART

A solid-state imaging apparatus is used in an imaging device, such as a digital still camera or a video camera, or an electronic device, such as a portable terminal device having an imaging function, for example. Examples of the solid-state imaging apparatus include an image sensor that reads a charge accumulated in a photoelectric transducer via a metal oxide semiconductor (MOS) transistor (refer to PTLs 1 to 4, for example).

In the image sensor of this type, each pixel has a reset transistor for resetting the signal level of a floating diffusion region (hereinafter referred to as FD) that holds a photoelectrically converted charge. When the reset transistor is turned off, a kTC noise, which is a kind of a thermal noise depending on the capacitance of the FD, is generated. Such a kTC noise occurs randomly at every reset.

CITATION LIST

Patent Literature

[PTL 1] Japanese Unexamined Patent Application Publication No. 2006-253316
[PTL 2] Japanese Unexamined Patent Application Publication No. 2010-212714
[PTL 3] Japanese Unexamined Patent Application Publication No. 2017-163087
[PTL 4] Japanese Unexamined Patent Application Publication No. 2016-63142

SUMMARY OF THE INVENTION

Incidentally, it has been desired to further reduce kTC noises in image sensors. Therefore, it is desirable to provide a solid-state imaging apparatus that makes it possible to further reduce kTC noises.

A first solid-state imaging apparatus according to one embodiment of the present disclosure includes a photoelectric transducer that photoelectrically converts incident light, a transfer transistor electrically connected to the photoelectric transducer, and a floating diffusion that temporarily holds a charge outputted from the photoelectric transducer through the transfer transistor. The first solid-state imaging apparatus further includes a reset transistor that resets a potential of the floating diffusion to a predetermined potential, an amplifier transistor that generates a pixel signal having a voltage corresponding to a level of the charge held in the floating diffusion, and a selection transistor that controls an output timing of the pixel signal from the amplifier transistor. The reset transistor includes a gate insulating film formed thinner than a gate insulating film of the transfer transistor.

In the first solid-state imaging apparatus according to one embodiment of the present disclosure, the reset transistor of the gate insulating film is formed thinner than the gate insulating film of the transfer transistor. This improves the oxide film capacitance of the reset transistor and reduces the on-resistance of the reset transistor.

A second solid-state imaging apparatus according to one embodiment of the present disclosure includes a photoelectric transducer that photoelectrically converts incident light, a transfer transistor electrically connected to the photoelectric transducer, and a floating diffusion that temporarily holds a charge outputted from the photoelectric transducer through the transfer transistor. The first solid-state imaging apparatus further includes a reset transistor that resets a potential of the floating diffusion to a predetermined potential, an amplifier transistor that generates a pixel signal having a voltage corresponding to a level of the charge held in the floating diffusion, and a selection transistor that controls an output timing of the pixel signal from the amplifier transistor. The reset transistor includes a gate insulating film formed of an insulating material having a dielectric constant higher than that of the gate insulating film of the transfer transistor.

In the second solid-state imaging apparatus according to one embodiment of the present disclosure, the gate insulating film of the reset transistor is formed of the insulating material having a dielectric constant higher than that of the gate insulating film of the transfer transistor. This improves the oxide film capacitance of the reset transistor and reduces the on-resistance of the reset transistor.

A third solid-state imaging apparatus according to an embodiment of the present disclosure includes a photoelectric transducer that photoelectrically converts incident light, a transfer transistor electrically coupled to the photoelectric transducer, and a floating diffusion that temporarily holds a charge outputted from the photoelectric transducer through the transfer transistor. The first solid-state imaging apparatus further includes a reset transistor that resets a potential of the floating diffusion to a predetermined potential, an amplifier transistor that generates a pixel signal having a voltage corresponding to a level of the charge held in the floating diffusion, and a selection transistor that controls an output timing of the pixel signal from the amplifier transistor. The reset transistor has an L length shorter than an L length of the transfer transistor, and the reset transistor has a W length longer than a W length of the transfer transistor.

In the third solid-state imaging apparatus according to one embodiment of the present disclosure, the L length of the reset transistor is shorter than the L length of the transfer transistor, and the W length of the reset transistor is longer than the W length of the transfer transistor. This reduces the on-resistance of the reset transistor.

A fourth solid-state imaging apparatus according to one embodiment of the present disclosure includes a photoelectric transducer that photoelectrically converts incident light, a transfer transistor electrically coupled to the photoelectric transducer, and a floating diffusion that temporarily holds a charge outputted from the photoelectric transducer through the transfer transistor. The first solid-state imaging apparatus further includes a reset transistor that resets a potential of the floating diffusion to a predetermined potential, an amplifier transistor that generates a pixel signal having a voltage corresponding to a level of the charge held in the floating diffusion, and a selection transistor that controls an output timing of the pixel signal from the amplifier transistor. The amplifier transistor and the selection transistor are configured by PMOS transistors formed in an n-well layer surrounded by a p-well layer.

In the fourth solid-state imaging apparatus according to one embodiment of the present disclosure, the amplifier transistor and the selection transistor are configured by the PMOS transistors formed in the n-well layer surrounded by the p-well layer. Thus, the flicker coefficient is lowered, which lowers the level of 1/f noise and the level of kTC noise.

The fifth solid-state imaging apparatus according to one embodiment of the present disclosure includes a photoelectric transducer that photoelectrically converts incident light, a transfer transistor electrically coupled to the photoelectric transducer, and a floating diffusion that temporarily holds a charge outputted from the photoelectric transducer through the transfer transistor. The first solid-state imaging apparatus further includes a reset transistor that resets a potential of the floating diffusion to a predetermined potential, an amplifier transistor that generates a pixel signal having a voltage corresponding to a level of the charge held in the floating diffusion, and a selection transistor that controls an output timing of the pixel signal from the amplifier transistor. The amplifier transistor has a WL area larger than a WL area of the transfer transistor.

In the fifth solid-state imaging apparatus according to one embodiment of the present disclosure, the WL area of the amplifier transistor is larger than the WL area of the transfer transistor. This improves the oxide film capacitance of the reset transistor and reduces the on-resistance of the reset transistor.

BRIEF DESCRIPTION OF DRAWINGS

FIG. 1 is a diagram illustrating an exemplary schematic configuration of a solid-state imaging apparatus according to one embodiment of the present disclosure.

FIG. 2 is a diagram illustrating exemplary circuit configurations of a sensor pixel and a readout circuit of FIG. 1.

FIG. 3 is a diagram illustrating exemplary planar configurations of the sensor pixel and the readout circuit of FIG. 1.

FIG. 4 is a diagram illustrating an exemplary cross-sectional configuration taken along a line A-A in FIG. 3.

FIG. 5 is a diagram illustrating a modification example of the cross-sectional configuration taken along the line A-A in FIG. 3.

FIG. 6 is a diagram illustrating exemplary frequency characteristics of a kTC noise when the on-resistance of a reset transistor is large and when the on-resistance of the reset transistor is small.

FIG. 7 is a diagram illustrating an exemplary one-dimensional potential in a global shutter mode.

FIG. 8A is a diagram illustrating exemplary imaging control in the global shutter mode.

FIG. 8B is a diagram illustrating the exemplary imaging control subsequent to FIG. 8A.

FIG. 8C is a diagram illustrating the exemplary imaging control subsequent to FIG. 8B.

FIG. 8D is a diagram illustrating the exemplary imaging control subsequent to FIG. 8C.

FIG. 8E is a diagram illustrating the exemplary imaging control subsequent to FIG. 8D.

FIG. 8F is a diagram illustrating the exemplary imaging control subsequent to FIG. 8E.

FIG. 9 is a diagram illustrating a modification example of the planar configuration of FIG. 3.

FIG. 10 is a diagram illustrating a modification example of the planar configuration of FIG. 3.

FIG. 11 is a diagram illustrating a modification example of the cross-sectional configuration of FIG. 4.

FIG. 12 is a diagram illustrating a modification example of the cross-sectional configuration of FIG. 5.

FIG. 13 is a diagram illustrating an exemplary schematic configuration of an electronic device including the solid-state imaging apparatus according to the foregoing embodiment and its modification example.

FIG. 14 is a diagram illustrating an exemplary flowchart of an imaging operation of the electronic device of FIG. 13.

FIG. 15 is a block diagram depicting an example of schematic configuration of a vehicle control system.

FIG. 16 is is a diagram of assistance in explaining an example of installation positions of an outside-vehicle information detecting section and an imaging section.

MODES FOR CARRYING OUT THE INVENTION

Hereinafter, some embodiments of the present disclosure are described in detail with reference to the drawings. Note that the description is given in the following order.
1. Embodiments (Solid-State Imaging Apparatus) . . . FIGS. 1, 2, 3, 4, 5, 6, 7, 8A, 8B, 8C, 8D, 8E, and 8F
2. Modification Examples (Solid-State Imaging Apparatus) . . . FIGS. 9 to 12
3. Examples of Application (Electronic Device) . . . FIGS. 13 and 14
4. Application Examples (Mobile Body) . . . FIGS. 15 and 16

1. Embodiments

Configuration

A solid-state imaging apparatus 1 according to one embodiment of the present disclosure will be described. The solid-state imaging apparatus 1 is, for example, a complementary metal oxide semiconductor (CMOS) image sensor. Note that the application of the present disclosure is not limited to the CMOS image sensor. The solid-state imaging apparatus 1 captures an image by receiving light from a subject to be imaged and photoelectrically converting the light to generate an image signal. The solid-state imaging apparatus 1 outputs a pixel signal in accordance with incident light.

FIG. 1 illustrates an exemplary schematic configuration of the solid-state imaging apparatus 1 according to one embodiment of the present disclosure. The solid-state imaging apparatus 1 includes a pixel array portion 10 and a logic circuit 20. The pixel array portion 10 has a plurality of sensor pixels 11 and a plurality of readout circuits 12 (described later). Each of the sensor pixels 11 performs photoelectric conversion to output a charge corresponding to the amount of received light. The plurality of sensor pixels 11 is provided opposed to a light receiving surface, and is arranged in a matrix in the pixel array portion 10. Each of the readout circuits 12 outputs a pixel signal based on the charge outputted from the sensor pixel 11. The plurality of readout circuits 12 is provided, for example, for the respective sensor pixels 11 in the pixel array portion 10.

The pixel array portion 10 has a plurality of pixel driving lines HSL and a plurality of data output lines VSL. The pixel driving line HSL is a wiring line to which a control signal to control the sensor pixel 11 and the readout circuit 12 is applied. For example, the pixel driving line HSL extends in a row direction. The data output line VSL is a wiring line for outputting the pixel signal received from each of the readout circuits 12 to the logic circuit 20. For example, the data output line VSL extends in a column direction.

The logic circuit 20 has, for example, a vertical drive circuit 21, a column signal processing circuit 22, a horizontal drive circuit 23 and a system control circuit 24. The logic circuit 20 (in specific, the horizontal drive circuit 23) provides image data to an external device by outputting an output voltage for each sensor pixel 11 to the external device.

The vertical drive circuit 21 selects any of the plurality of sensor pixels 11 in order on a predetermined pixel-row unit basis. The term "predetermined pixel-row unit" refers to the pixel rows of pixels selectable at the same address, for example. In a case where one sensor pixel 11 is allocated to a single readout circuit 12, the "predetermined pixel-row unit" refers to a single pixel row. The vertical drive circuit 21 controls a transistor in each sensor pixel 11 (e.g., a transfer transistor TRG and a discharge transistor OFG) via the pixel driving line HSL, and further controls a transistor in each readout circuit 12 (e.g., a reset transistor RST and a selection transistor SEL).

The column signal processing circuit 22 performs a double delta sampling (DDS) process on the pixel signals outputted from the respective sensor pixels 11 in the row selected by the vertical drive circuit 21, for example. The DDS process will be described in detail later. The column signal processing circuit 22 performs, for example, the DDS process to extract the signal level of the pixel signal and hold pixel data corresponding to the amount of light received by each sensor pixel 11. The column signal processing circuit 22 has a column-signal processor for each data output line VSL, for example. The column signal processing unit includes a single slope A/D converter, for example. The single-slope A/D converter includes, for example, a comparator and a counter circuit. The horizontal drive circuit 23 sequentially outputs the pixel data held in the column signal processing circuit 22 to the outside, for example. The system control circuit 24 controls, for example, driving of each block (the vertical drive circuit 21, the column signal processing circuit 22, and the horizontal drive circuit 23) in the logic circuit 20.

FIG. 2 illustrates exemplary circuit configurations of the sensor pixel 11 and the readout circuit 12. In the example illustrated in FIG. 2, one sensor pixel 11 is allocated to one readout circuit 12. The components of the sensor pixels 11 are common between the sensor pixels 11. Each of the sensor pixels 11 includes, for example, a photodiode PD, a transfer transistor TRG, a floating diffusion FD, a discharge transistor OFG, and a discharge floating diffusion OFD. The transfer transistor TRG and the discharge transistor OFG are, for example, metal oxide semiconductor (NMOS) transistors. The photodiode PD corresponds to one specific example of the "photoelectric transducer" of the present disclosure.

The photodiode PD photoelectrically converts the light (incident light) incident through the light receiving surface. The photodiode PD performs photoelectric conversion to generate a charge corresponding to the amount of the received light. The photodiode PD is, for example, a PN-junction photoelectric transducer. The photodiode PD has a cathode electrically coupled to a source of a first transfer transistor TRX, and an anode electrically coupled to a referential potential line (e.g., a ground GND).

The transfer transistor TRG is coupled to the photodiode PD. In specific, the transfer transistor TRG is coupled between the photodiode PD and the floating diffusion FD, and transfers the charge held in the photodiode PD to the floating diffusion FD in response to a control signal applied to the gate of the transfer transistor TRG. For example, when the discharge transistor OFG is turned off and the transfer transistor TRG is turned on, the charge held in the photodiode PD is transferred to the floating diffusion FD through the transfer transistor TRG. The drain of the transfer transistor TRG is electrically coupled to the floating diffusion FD, and the gate of transfer transistor TRG is coupled to the pixel driving line HSL.

Further, the transfer transistor TRG controls the height (potential ($\varphi_{TRG}$) of a potential barrier 50 described later (refer to FIG. 6 described later) in response to a control signal applied to the gate of the transfer transistor TRG. For example, when the transfer transistor TRG is turned on, the height of the potential barrier 50 (potential $\varphi_{TRG}$) is larger than the potential of the photodiode PD. Additionally, for example, when the transfer transistor TRG is turned off, the height of the potential barrier 50 (potential $\varphi_{TRG}$) is smaller than the height of a potential barrier 40 (potential $\varphi_{OFG}$) described later (refer to FIG. 6 described later).

The floating diffusion FD is a floating diffusion region that temporarily holds the charge outputted from the photodiode PD through the transfer transistor TRG. In the present embodiment, no additional region that temporarily holds the charge outputted from the photodiode PD is provided other than the floating diffusion FD. For example, the reset transistor RST is coupled to the floating diffusion FD, and the vertical signal line VSL is coupled to the floating diffusion FD via an amplifier transistor AMP and the selection transistor SEL.

The discharge transistor OFG is coupled between the photodiode PD and the power supply line VDD. The discharge transistor OFG initializes (resets) the photodiode PD in response to a control signal applied to the gate of the discharge transistor OFG. For example, when the discharge transistor OFG is turned on, the potential of the photodiode PD is reset to the potential level of the power supply line VDD. That is, the photodiode PD is initialized. The drain of the discharge transistor OFG is coupled to the power supply line VDD, the source of the discharge transistor OFG is coupled to the photodiode PD, and the gate of the discharge transistor OFG is coupled to the pixel driving line HSL.

The reset transistor RST is coupled between the floating diffusion FD and the power supply line VDD. The reset transistor RST initializes (resets) the floating diffusion FD in response to a control signal applied to the gate of the reset transistor RST. For example, when the reset transistor RST is turned on, the potential of the floating diffusion FD is reset to a predetermined potential (the potential level of the power supply line VDD). That is, the floating diffusion FD is initialized. The drain of the reset transistor RST is coupled to the power supply line VDD, the source of the reset transistor RST is coupled to the floating diffusion FD, and the gate of the reset transistor RST is coupled to the pixel driving line HSL.

The amplifier transistor AMP has a gate coupled to the floating diffusion FD, a drain coupled to the power supply line VDD, and a source coupled to the drain of the selection transistor SEL. The amplifier transistor AMP serves as an input unit of a source follower circuit that reads a charge obtained by photoelectric conversion in the photodiode PD.

Because the source of the amplifier transistor AMP is coupled to the vertical signal line VSL via the selection transistor SEL, the amplifier transistor AMP constitutes a constant current source and a source follower circuit coupled to one end of the vertical signal line VSL. The amplifier transistor AMP generates a pixel signal having a voltage corresponding to the level of charge held in the floating diffusion FD, and outputs the pixel signal to the vertical signal line VSL via the selection transistor SEL.

The selection transistor SEL has a drain coupled to the source of the amplifier transistor AMP, a source coupled to the vertical signal line VSL, and a gate coupled to the pixel driving line HSL. The selection transistor SEL controls the output timing of the pixel signal outputted from the amplifier transistor AMP to the vertical signal line VSL on the basis of a control signal applied to the gate of the selection transistor SEL. When the control signal is turned on, the selection transistor SEL becomes electrically continuous, and the sensor pixel 11 coupled to the selection transistor SEL is selected. When the sensor pixel 11 is selected, the pixel signal outputted from the amplifier transistor AMP is read and transferred to the column signal processing circuit 22 via the vertical signal line VSL.

Next, the arrangement of the sensor pixel 11 and the readout circuit 12 will be described in detail. FIG. 3 illustrates exemplary planar configurations of the sensor pixel 11 and the readout circuit 12. FIGS. 4 and 5 illustrate an exemplary cross-sectional configuration taken along the line A-A of FIG. 3. In the example illustrated in FIGS. 3 to 5, one sensor pixel 11 is allocated to one readout circuit 12. FIGS. 3 to 5 are schematic diagrams and are not necessarily precise illustrations. In FIGS. 4 and 5, the density of the impurity concentration is represented by "P+", "N−", and "N+". Here, "P+" indicates that the concentration of a p-type impurity (acceptor) is higher than $1\times10^{16}$ cm$^{-3}$ to $5\times10^{18}$ cm$^{-3}$. "N+" indicates that the concentration of an n-type impurity (donor) is higher than "N−". In a portion indicated by "N−", the concentration of the n-type impurity (donor) is within a range of $1\times10$ cm$^{-3}$ to $5\times10^{18}$ cm$^{-3}$, for example.

The sensor pixel 11 and the readout circuit 12 are formed on a semiconductor substrate 30. The semiconductor substrate 30 is, for example, a silicon substrate. The semiconductor substrate 30 has a p-well layer 32 on an upper surface of the semiconductor substrate 30 and in the vicinity thereof, and has an n-type semiconducting layer 31 at a position deeper than p-well layer 32. The p-well layer 32 is a p-type semiconductor region formed on the upper surface of the semiconductor substrate 30 and in the vicinity thereof. A plurality of n-type semiconductor regions 34 are formed in the p-well layer 32. Each of the n-type semiconductor regions 34 formed in the p-well layer 32 is a semiconductor region having a high n-type impurity concentration. The plurality of n-type semiconductor regions 34 constitute, for example, source regions and drain regions of the transfer transistor TRG, the discharge transistor OFG, the reset transistor RST, the amplifier transistor AMP, and the selection transistor SEL, the floating diffusion FD, and the discharge floating diffusion OFD.

Gate insulating films 33 used for, for example, the transfer transistor TRG, the discharge transistor OFG, the reset transistor RST, the amplifier transistor AMP, and the selection transistor SEL are formed on the surface of the semiconductor substrate 30. The gate insulating films 33 are formed of, for example, silicon oxide. Note that the thicknesses of the gate insulating films 33 may be the same between all of the transistors, or may be different for each transistor.

For example, as illustrated in FIG. 4, the gate insulating film 33 of the reset transistor RST may be thinner than the gate insulating films 33 of the amplifier transistor AMP and the selection transistor SEL. In this case, the gate insulating film 33 of the reset transistor RST may be thinner than the gate insulating film 33 of the transfer transistor TRG. A difference in the thickness of the gate insulating film 33 between the reset transistor RST and the transfer transistor TRG is greater than variations in the thicknesses of the gate insulating films 33. The gate insulating film 33 of the reset transistor RST is thick enough to secure the pressure resistance of the reset transistor RST. Such a reduction in the thickness of the gate insulating film 33 of the reset transistor RST improves the oxide film capacitance Cox of the reset transistor RST, reducing the on-resistance $R_{on}$ of the reset transistor RST. As a result, as illustrated in FIG. 6, for example, the frequency characteristic of the kTC noise becomes broader, and the noise level becomes lower than those observed when the on-resistance $R_{on}$ is large.

Further, as illustrated in FIG. 5, for example, the gate insulating films 33 of the reset transistor RST, the amplifier transistor AMP, and the selection transistor SEL may be thin. In this case, the gate insulating films 33 of the reset transistor RST, the amplifier transistor AMP, and the selection transistor SEL may be thinner than the gate insulating film 33 of the transfer transistor TRG. A difference in the thickness of the gate insulating films 33 of the reset transistor RST, the amplifier transistor AMP, and the selection transistor SEL from the thickness of the gate insulating film 33 of the transfer transistor TRG is greater than variations in the thicknesses of the gate insulating films 33. The gate insulating films 33 of the reset transistor RST, the amplifier transistor AMP, and the selection transistor SEL are thick enough to secure the pressure resistance of the reset transistor RST, the amplifier transistor AMP, and the selection transistor SEL. Such a reduction in the thicknesses of the gate insulating films 33 of the reset transistor RST, the amplifier transistor AMP, and the selection transistor SEL improves the oxide film capacitances Cox of the reset transistor RST, the amplifier transistor AMP, and the selection transistor SEL, reducing the on-resistances $R_{on}$ of the reset transistor RST, the amplifier transistor AMP, and the selection transistor SEL. As a result, as illustrated in FIG. 6, for example, the frequency characteristic of the kTC noise becomes broader, and the noise level becomes lower than those observed when the on-resistance $R_{on}$ is large.

As illustrated in FIG. 7, for example, the potential barrier 50 is formed between the photodiode PD and the floating diffusion FD in the p-well layer 32. That is, the sensor pixel 11 has the potential barrier 50 between the photodiode PD and the floating diffusion FD. The potential barrier 50 is formed by the p-well layer 32 formed between the photodiode PD and the floating diffusion FD. When the transfer transistor TRG, the discharge transistors OFG, and the reset transistor RST are turned off, the height (potential $\varphi_{TRG}$) of the potential barrier 50 is higher than the potential of photodiode PD, for example, and is approximately the same as the height (potential $\varphi_{OFG}$) of the potential barrier 40 described later.

As illustrated in FIG. 7, for example, the potential barrier 40 and a potential barrier 60 are formed around the area of the p-well layer 32 including the photodiode PD and the floating diffusion FD. That is, the sensor pixel 11 includes the potential barriers 40 and 60 around the area including the photodiode PD and the floating diffusion FD. The potential barriers 40 and 60 are formed by the p-well layer 32 formed around the area including the photodiode PD and the floating diffusion FD. The potential barrier 40 is formed in a portion of the p-well layer 32 facing the gate of the discharge transistor OFG. The potential barrier 60 is formed at a portion of the p-well layer 32 facing the gate of the reset transistor RST. When the transfer transistor TRG, the discharge transistors OFG, and the reset transistor RST are turned off, the height (potential $\varphi_{OFG}$) of the potential barrier 40 and the height (potential $\varphi_{RST}$) of the potential barrier 60 are higher than the potential of the photodiode PD, for example, and are approximately the same as the height (potential $\varphi_{TRG}$) of the potential barrier 50, for example.

Imaging Mode

Next, an imaging procedure of the solid-state imaging apparatus 1 according to the present embodiment will be described.

The solid-state imaging apparatus 1 (in specific, the system control circuit 24) selects an imaging method on the basis of an imaging command from an operation unit 250 described later, for example, and performs an operation in accordance with the selected imaging method. The imaging command includes, for example, an imaging command for performing the DDS process in a global shutter mode. In this case, the solid-state imaging apparatus 1 (in specific, the system control circuit 24) controls the transfer transistor TRG, the discharge transistors OFG, the reset transistor RST, the amplifier transistor AMP, and the selection transistor SEL in the global shutter mode. The solid-state imaging apparatus 1 (in specific, the system control circuit 24) further performs the DDS process. The global shutter mode is an imaging method suitable for continuous imaging (capturing moving images) of a moving subject, such as a soccer game. The DDS process refers to a series of processes described below.

FIG. 8A illustrates an exemplary one-dimensional potential at the onset of accumulation in the global shuttering method. FIG. 8B illustrates an exemplary one-dimensional potential at the completion of the accumulation in the global shutter mode. FIG. 8C illustrates an exemplary one-dimensional potential at the time of all-row batch transmission in the global shutter mode. FIG. 8D illustrates an exemplary one-dimensional potential at the time of D-phase reading in the global shutter mode. FIG. 8E illustrates an exemplary one-dimensional potential at the time of resetting in the global shutter mode. FIG. 8F illustrates an exemplary one-dimensional potential at the time of P-phase reading in the global shutter mode.

First, prior to starting imaging, the solid-state imaging apparatus 1 (in specific, the system control circuit 24) turns on the discharge transistor OFG, and discharges extra charges remaining in the photodiode PD to the outside (FIG. 8A). Thereafter, the solid-state imaging apparatus 1 (in specific, the system control circuit 24) starts imaging. In specific, the solid-state imaging apparatus 1 (in specific, the system control circuit 24) starts accumulating a charge while the transfer transistor TRG and the discharge transistor (OFG) are turned off. Then, a charge $N_{sig}$ generated by the photoelectric conversion in the photodiode PD starts to accumulate in the photodiode PD (FIG. 8B).

When the photoelectric conversion in the photodiode PD is completed, the solid-state imaging apparatus 1 (in specific, the system control circuit 24) turns on the transfer transistor TRG to increase the potential $\varphi_{TRG}$, and thereby discharges (transfers) the charge $N_{sig}$ accumulated in the photodiode PD to the floating diffusion FD (FIG. 8C). In this case, the solid-state imaging apparatus 1 (in specific, the system control circuit 24) simultaneously performs this transferring operation on all of the sensor pixels 11. That is, the solid-state imaging apparatus 1 (in specific, the system control circuit 24) performs accumulation control that causes a charge generated from the incident light by the photodiode PD to accumulate in the floating diffusion FD.

Thereafter, the solid-state imaging apparatus 1 (in specific, the system control circuit 24) turns off the transfer transistor TRG (FIG. 8D). At this time, the solid-state imaging apparatus 1 (in specific, the system control circuit 24) turns on the selection transistor SEL. As a result, the solid-state imaging apparatus 1 (in specific, the system control circuit 24) causes the amplifier transistor AMP to generate a pixel signal having a signal level corresponding to the potential of the floating diffusion FD potential (the potential generated by the charge $N_{sig}$), and outputs the generated pixel signal to the vertical signal line VSL via the selection transistor SEL. The solid-state imaging apparatus 1 (in specific, the system control circuit 24) performs this reading operation on a predetermined pixel-row unit basis. The solid-state imaging apparatus 1 (in specific, the system control circuit 24) outputs the signal voltage $V_{sig}$ obtained in this manner to, for example, a DSP circuit 210 described later. That is, the solid-state imaging apparatus 1 (in specific, the system control circuit 24) performs the D-phase reading control that reads a voltage (signal voltage $V_{sig}$) corresponding to the level of charge held in the floating diffusion FD.

Next, the solid-state imaging apparatus 1 (in specific, the system control circuit 24) turns on the reset transistor RST to discharge the charge accumulated in the floating diffusion FD to the outside (FIG. 8E). That is, the solid-state imaging apparatus 1 (in specific, the system control circuit 24) performs reset control that resets the charge held in the floating diffusion FD.

Thereafter, the solid-state imaging apparatus 1 (in specific, the system control circuit 24) turns off the reset transistor RST (FIG. 8F). At this time, the solid-state imaging apparatus 1 (in specific, the system control circuit 24) turns on the selection transistor SEL. As a result, the amplifier transistor AMP generates a pixel signal having a signal level corresponding to the potential generated by a charge $N_{KTC}$ slightly accumulated the in the floating diffusion FD due to the kTC noise, and outputs the generated pixel signal to the vertical signal line VSL via the selection transistor SEL. The solid-state imaging apparatus 1 (in specific, the system control circuit 24) performs this reading operation on a predetermined pixel-row unit basis. The solid-state imaging apparatus 1 (in specific, the system control circuit 24) outputs the reset voltage $V_{RST}$ obtained in this manner to, for example, the DSP circuit 210 described later. That is, the solid-state imaging apparatus 1 (in specific, the system control circuit 24) performs the P-phase reading control that reads a voltage (reset voltage $V_{RST}$) corresponding to the level of charge held in the floating diffusion FD after the reset operation. In this manner, the DDS process is performed in the global shutter mode.

Effects

Next, effects of the solid-state imaging apparatus 1 according to the present embodiment will be described.

Generally, each pixel in an image sensor includes a reset transistor for resetting the signal level of a floating diffusion that holds a photoelectrically converted charge. When the reset transistor is turned off, a kTC noise is generated that is a kind of a thermal noise depending on the capacitance of the floating diffusion. The kTC noise occurs randomly at every reset.

Generally, the kTC noise may be completely eliminated by a noise cancellation technique called correlation double sampling (CDS). The CDS involves reading the voltage of the floating diffusion after resetting by the reset transistor (hereinafter, referred to as a reset voltage), and thereafter transferring the charge photoelectrically converted by the photodiodes to the floating diffusion, and reading the voltage of the floating diffusion holding the photoelectrically converted charge (hereinafter, referred to as a signal voltage). Then, the kTC noise is cancelled by performing a subtraction between the reset voltage and the signal voltage to obtain a signal component that does not include a kTC noise.

Such a technique that reads the reset voltage by resetting the floating diffusion prior to reading the signal voltage is referred to as a "pre-reset method". The pre-reset method is based on assumption that the pixel is provided with a portion having a function of retaining a photoelectrically converted charge until the reset voltage is read by resetting the floating diffusion. In the case of an image sensor, the photodiode has the function of performing the photoelectric conversion and holding the charge obtained by the photoelectric conversion.

However, when the signal voltage is read from the floating diffusion that holds the photoelectrically converted charge in the global shutter mode, it is impossible to apply the pre-reset method described above to the CDS. Therefore, in this case, the signal voltage of the floating diffusion is read while the charge generated by the photodiode is held in the floating diffusion, and thereafter the "post-reset method" is used to read the reset voltage by resetting the floating diffusion.

However, according to the post-reset method, the kTC noise included in the reset voltage is different from the kTC noise included in the signal voltage. Further, the kTC noises generated by the reset operation are not constant and have variations. Therefore, according to the post-reset method, there is a problem that it is difficult to completely cancel the kTC noise even if the subtraction between the reset voltage and the signal voltage is performed in the CDS.

In contrast, according to the present embodiment, the imaging operation is performed through the post-reset method in the global shutter mode. In this case, the gate insulating film 33 of the reset transistor RST is formed thinner than the gate insulating film 33 of the transfer transistor TRG. This increases the oxide film capacitance Cox of the reset transistor RST and reduces the on-resistance $R_{on}$ of the reset transistor RST. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises.

Further, according to the present embodiment, the gate insulating films 33 of the amplifier transistor AMP and the selection transistor SEL are formed thinner than the gate insulating film 33 of the transfer transistor TRG. This increases the oxide film capacitances Cox of the amplifier transistor AMP and the selection transistor SEL, and reduces the on-resistances $R_{on}$ of the amplifier transistor AMP and the selection transistor SEL. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises.

2. Modification Examples

Modification examples of the solid-state imaging apparatus 1 according to the foregoing embodiment will be described below.

Modification Example A

In the foregoing embodiment, the gate insulating film 33 of the reset transistor RST may be formed of an insulating material having a dielectric constant higher than that of the gate insulating film 33 of the transfer transistor TRG. Examples of such an insulating material include an amorphous material including $HfO_2$, which is an oxide, and $SiO_2$, $Al_2O_3$, or the like. This improves the oxide film capacitance Cox of the reset transistor RST and reduces the on-resistance $R_{on}$ of the reset transistor RST. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises.

Further, in the present modification example, the gate insulating films 33 of the amplifier transistor AMP and the selection transistor SEL may be formed of an insulating material having a dielectric constant higher than that of the gate insulating film 33 of the transfer transistor TRG. Examples of such an insulating material include an amorphous material including $HfO_2$, which is an oxide, and $SiO_2$, $Al_2O_3$, or the like. This improves the oxide film capacitances Cox of the amplifier transistor AMP and the selection transistor SEL, and reduces the on-resistances $R_{on}$ of the amplifier transistor AMP and the selection transistor SEL. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises.

It is to be noted that, in the present modification example, the gate insulating films 33 of the reset transistor RST may be formed to have a thickness equivalent to that of the gate insulating film 33 of the transfer transistor TRG or to be thicker than the gate insulating film 33 of the transfer transistor TRG. Even in this case, since the gate insulating film 33 of the reset transistor RST is formed of the insulating material having a dielectric constant higher than that of the gate insulating film 33 of the transfer transistor TRG, it is possible to obtain image data with less kTC noises.

Further, in the present modification example, the gate insulating films 33 of the amplifier transistor AMP and the selection transistor SEL may be formed to have a thickness equivalent to that of the gate insulating film 33 of the transfer transistor TRG or to be thicker than the gate insulating film 33 of the transfer transistor TRG. Even in such cases, since the gate insulating films 33 of the amplifier transistor AMP and the selection transistor SEL are formed of the insulating material having a dielectric constant higher than the gate insulating film 33 of the transfer transistor TRG, it is possible to obtain image data with less kTC-noises.

Modification Example B

In the foregoing embodiment and Modification Example A, the mobility of the reset transistor RST may be higher than the mobility of the transfer transistor TRG. In this case, the on-resistance $R_{on}$ of the reset transistor RST is reduced. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises.

Further, in the present modification example, the mobility of the amplifier transistor AMP and the selection transistor SEL may be higher than the mobility of the transfer transistor TRG. In this case, the on-resistances $R_{on}$ of the amplifier transistor AMP and the selection transistor SEL are reduced. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises. It is to be noted that, in the present modification example, the gate insulating film 33 of the reset transistor RST may be formed to have a thickness equivalent to that of the gate insulating film 33 of the transfer transistor TRG or to be thicker than the gate insulating film 33 of the transfer transistor TRG.

Modification Example C

In the foregoing embodiment and Modification Examples A and B, as illustrated in FIG. 9, for example, the L length of the reset transistor RST may be shorter than the L length of the transfer transistor TRG, and the W length of the reset transistor RST may be longer than the W length of the transfer transistor TRG. In this case, it is preferable that the WL area (W length×L length) of the reset transistor RST be equal to the WL area of the transfer transistor TRG. As the WL area becomes smaller, flicker noises tend to increase. Therefore, the reset transistor RST having a WL area smaller than the WL area of the transfer transistor TRG is not preferable from the viewpoint of noise reduction.

In this case, the on-resistance $R_{on}$ of the reset transistor RST is reduced. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises. In the present modification example, the gate insulating film 33 of the reset transistor RST may be formed to have a thickness equivalent to that of the gate insulating film 33 of the transfer transistor TRG or to be thicker than the gate insulating film 33 of the transfer transistor TRG.

Modification Example D

In the foregoing embodiment and Modification Examples A, B, and C, the WL area of the amplifier transistor AMP may be larger than the WL area of the transfer transistor TRG. In the foregoing embodiment and Modification Examples A, B, and C, as illustrated in FIG. 10, for example, the L length of the amplifier transistor AMP may be longer than the L length of the transfer transistor TRG, and the W length of the reset transistor RST may be longer than the W length of the transfer transistor TRG. In such a case, the oxide film capacitance Cox of the amplifier transistor AMP is improved, and the on-resistance $R_{on}$ of the amplifier transistor AMP is reduced. As a result, as illustrated in FIG. 6, for example, the frequency characteristic of the kTC noise becomes broader, and the noise level becomes lower than those observed when the on-resistance $R_{on}$ is large. Therefore, it is possible to obtain image data with less kTC noises.

In the present modification example, the gate insulating film 33 of the reset transistor RST may be formed to have a thickness equivalent to that of the gate insulating film 33 of the transfer transistor TRG or to be thicker than the gate insulating film 33 of the transfer transistor TRG.

Modification Example E

In the foregoing embodiment and Modification Examples A, B, C, and D, as illustrated in FIGS. 11 and 12, for example, the amplifier transistor AMP and the selection transistor SEL may be formed of PMOS transistors formed in the n-well layer 35 surrounded by the p-well layer 32. The n-well layer 35 is an n-type semiconductor region formed on the upper surface of the semiconductor substrate 30 and in the vicinity thereof. The mobility of the PMOS transistor is lower than that of an NMOS transistor. Thus, the flicker coefficient is lowered, and the level of 1/f noise is lowered. Additionally, the level of kTC noise is lowered. Therefore, it is possible to obtain image data with less kTC noise or less 1/f noise.

3. Examples of Application

An application of the present disclosure should not be limited to the solid-state imaging apparatus. That is, the present technology may be applied to general electronic devices having a solid-state imaging apparatus, such as a camera module having an optical lens system or the like, imaging devices including a digital still camera and a video camera, portable terminal devices having an imaging function (e.g., a smart phone or a tablet-type terminal), or a copying machine using a solid-state imaging apparatus in an image reading unit, in addition the solid-state imaging apparatus.

FIG. 13 is a block diagram illustrating an exemplary configuration of an electronic device 2 including the solid-state imaging apparatus 1 according to the foregoing embodiment and its modification examples.

The electronic device 2 is, for example, an imaging device, such as a digital still camera or a video camera, or an electronic device, such as a portable terminal device including a smartphone or a tablet-type terminal. The electronic device 2 includes, for example, the solid-state imaging apparatus 1 according to the foregoing embodiment and its modification examples, the DSP circuit 210, a frame memory 220, a display unit 230, a storage unit 240, an operation unit 250, and a power supply unit 260. In the electronic device 2, the DSP circuit 210, the frame memory 220, the display unit 230, the storage unit 240, the operation unit 250, and the power supply unit 260 are coupled to each other via a bus line 270.

The solid-state imaging apparatus 1 according to the foregoing embodiment and its modification examples outputs image data corresponding to the incident light. The DSP circuit 210 is a signal processing circuit that processes a signal (image data) outputted from the solid-state imaging apparatus 1 according to the foregoing embodiment and its modification examples. For example, the DSP circuit 210 acquires the signal voltage $V_{sig}$ outputted from the solid-state imaging apparatus 1 as first image data, and acquires the reset voltage $V_{RST}$ outputted from the solid-state imaging apparatus 1 as second image data. Then, the DSP circuit 210 generates image data with less kTC noises by subtracting the second image data from the first image data, for example.

The frame memory 220 temporarily stores the image data with less kTC noises on a frame unit basis. The display unit 230 is, for example, a panel-type display device such as a liquid crystal panel or an organic electro luminescence (EL) panel, and displays a moving image or a still image captured by the solid-state imaging apparatus 1 according to the foregoing embodiment and its modification examples. The storage unit 240 records image data including the moving image or the still image captured by the solid-state imaging apparatus 1 according to the foregoing embodiment and its modification examples on a recording medium such as a semiconductor memory or a hard disk. The operation unit 250 issues an operation command for various functions of the electronic device 2 in accordance with an operation by the user. The power supply unit 260 respectively supplies various electric powers serving as operation powers to the DSP circuitry 210, the frame memory 220, the display unit 230, the storage unit 240, and the operation unit 250, as appropriate.

Next, an imaging procedure of the electronic device 2 will be described.

FIG. 14 illustrates an exemplary flowchart of an imaging operation of the electronic device 2 in the global shutter mode. The user selects the start of imaging by operating the operation unit 250 (Step S101). When the user selects the start of imaging, the operation unit 250 transmits an imaging command to the solid-state imaging apparatus 1 (Step S102). When receiving the imaging command from the operation unit 250, the solid-state imaging apparatus 1 (in specific, the system control circuit 24) performs imaging in the global shutter mode, as in the procedure illustrated in FIGS. 8A, 8B, 8C, 8D, 8E, and 8F, for example (Step S103).

The solid-state imaging apparatus 1 outputs the image data obtained by imaging (the first image data and the second image data) to the DSP circuit 210. On the basis of the image data (the first image data and the second image data) received from the solid-state imaging apparatus 1, the DSP circuit 210 performs a kTC-noise reduction process (Step S105). In specific, the DSP circuit 210 generates image data with less kTC noises by subtracting the second image data from the first image data. The DSP circuitry 210 causes the frame memory 220 to hold the image data with less kTC noises. The frame memory 220 causes the storage unit 240 to store the image data with less kTC noises, if necessary (Step S105). In this manner, the imaging by the electronic device 2 is performed.

In the electronic device 2, the solid-state imaging apparatus 1 according to the foregoing embodiment and its modification examples is used. Thus, it is possible to obtain a high-resolution captured image with less kTC noises.

4. Application Examples

The technology according to the present disclosure (the present technology) is applicable to various products. For example, the technology according to the present disclosure may be achieved in the form of an apparatus to be mounted to a mobile body of any kind. Examples of the mobile body may include an automobile, an electric vehicle, a hybrid electric vehicle, a motorcycle, a bicycle, a personal mobility device, an airplane, a drone, a vessel, and a robot, for example.

FIG. 15 is a block diagram illustrating a schematic configuration example of a vehicle control system which is an example of a mobile body control system to which the technology according to the present disclosure may be applied.

The vehicle control system 12000 includes a plurality of electronic control units connected to each other via a communication network 12001. In the example depicted in FIG. 15, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 15, an audio speaker 12061, a display section 12062, and an instrument panel 12063 are illustrated as the output device. The display section 12062 may, for example, include at least one of an on-board display and a head-up display.

FIG. 16 is a diagram depicting an example of the installation position of the imaging section 12031.

In FIG. 16, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 16 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

As described above, an example of a mobile body control system to which the technology according to the present disclosure may be applied has been described. The technology according to the present disclosure may be applied to the imaging section 12031 in the configuration described above. In specific, the solid-state imaging apparatus 1 according to the foregoing embodiment and its modification examples may be applied to the imaging section 12031. It is possible to obtain a high-resolution captured image with less kTC noises by applying the technology according to the present disclosure to the imaging section 12031. Therefore, it is possible to perform high-precision control utilizing the captured image in the mobile body control system.

Although the present disclosure has been described with reference to the embodiments and their modification examples, examples of application, and application examples, the present disclosure should not be limited to the foregoing embodiments and the like, and various modifications may be made. It is to be noted that the effects described herein are merely illustrative. The effect of the present disclosure should not be limited to the effects described herein. The present disclosure may have other effects than those described herein.

The present disclosure may also have a following configuration.

(1)
A solid-state imaging apparatus including:
a photoelectric transducer that photoelectrically converts incident light;
a transfer transistor electrically coupled to the photoelectric transducer;
a floating diffusion that temporarily holds a charge outputted from the photoelectric transducer via the transfer transistor;
a reset transistor that resets a potential of the floating diffusion to a predetermined potential;
an amplifier transistor that generates a pixel signal having a voltage corresponding to a level of the charge held in the floating diffusion; and
a selection transistor that controls an output timing of the pixel signal from the amplifier transistor, in which
the reset transistor includes a gate insulating film formed thinner than a gate insulating film of the transfer transistor.
(2)
The solid-state imaging apparatus according to (1), in which
the amplifier transistor and the selection transistor each include a gate insulating film formed thinner than the gate insulating film of the transfer transistor.
(3)
The solid-state imaging apparatus according to (1) or (2), further including
a controller that controls the transfer transistor, the reset transistor, the amplifier transistor, and the selection transistor in a global shutter mode.
(4)
The solid-state imaging apparatus according to (3), in which
the controller performs, in order, D-phase reading control that reads the voltage corresponding to the level of the charge held in the floating diffusion, reset control that resets the charge held in the floating diffusion, P-phase reading control that reads the voltage corresponding to the level of the charge held in the floating diffusion after the reset operation, and accumulation control that causes a charge generated from the incident light by the photoelectric transducer to accumulate in the floating diffusion.
(5)
A solid-state imaging apparatus including:
a photoelectric transducer that photoelectrically converts incident light;
a transfer transistor electrically coupled to the photoelectric transducer;
a floating diffusion that temporarily holds a charge outputted from the photoelectric transducer via the transfer transistor;
a reset transistor that resets a potential of the floating diffusion to a predetermined potential;
an amplifier transistor that generates a pixel signal having a voltage corresponding to a level of the charge held in the floating diffusion; and
a selection transistor that controls an output timing of the pixel signal from the amplifier transistor, in which
the reset transistor includes a gate insulating film formed of an insulating material having a dielectric constant higher than that of a gate insulating film of the transfer transistor.
(6)
The solid-state imaging apparatus according to (5), in which
the amplifier transistor and the selection transistor each include a gate insulating film formed of an insulating material having a dielectric constant higher than that of the gate insulating film of the transfer transistor.
(7)
The solid-state imaging apparatus according to (5) or (6), further including
a controller that controls the transfer transistor, the reset transistor, the amplifier transistor, and the selection transistor in a global shutter mode.
(8)
The solid-state imaging apparatus according to (7), in which
the controller performs, in order, D-phase reading control that reads the voltage corresponding to the level of the charge held in the floating diffusion, reset control that resets the charge held in the floating diffusion, P-phase reading control that reads the voltage corresponding to the level of the charge held in the floating diffusion after the reset operation, and accumulation control that causes a charge generated from the incident light by the photoelectric transducer to accumulate in the floating diffusion.
(9)
A solid-state imaging apparatus including:
a photoelectric transducer that photoelectrically converts incident light;
a transfer transistor electrically coupled to the photoelectric transducer;
a floating diffusion that temporarily holds a charge outputted from the photoelectric transducer via the transfer transistor;
a reset transistor that resets a potential of the floating diffusion to a predetermined potential;
an amplifier transistor that generates a pixel signal having a voltage corresponding to a level of the charge held in the floating diffusion; and a selection transistor that controls an output timing of the pixel signal from amplifier transistor, in which the reset transistor has an L length shorter than an L length of the transfer transistor, and the reset transistor has a W length longer than the W length of the transfer transistor.

(10)

The solid-state imaging apparatus according to (9), further including a controller that controls the transfer transistor, the reset transistor, the amplifier transistor, and the selection transistor in a global shutter mode.

(11)

The solid-state imaging apparatus according to (10), in which the controller performs, in order, D-phase reading control that reads the voltage corresponding to the level of the charge held in the floating diffusion, reset control that resets the charge held in the floating diffusion, P-phase reading control that reads the voltage corresponding to the level of the charge held in the floating diffusion after the reset operation, and accumulation control that causes a charge generated from the incident light by the photoelectric transducer to accumulate in the floating diffusion.

(12)

A solid-state imaging apparatus including:

a photoelectric transducer that photoelectrically converts incident light;

a transfer transistor electrically coupled to the photoelectric transducer;

a floating diffusion that temporarily holds a charge outputted from the photoelectric transducer via the transfer transistor;

a reset transistor that resets a potential of the floating diffusion to a predetermined potential;

an amplifier transistor that generates a pixel signal having a voltage corresponding to a level of the charge held in the floating diffusion; and a selection transistor that controls an output timing of the pixel signal from amplifier transistor, in which the amplifier transistor and the selection transistor are configured by PMOS transistors formed in an n-well layer surrounded by a p-well layer.

(13)

The solid-state imaging apparatus according to (12), further including a controller that controls the transfer transistor, the reset transistor, the amplifier transistor, and the selection transistor in a global shutter mode.

(14)

The solid-state imaging apparatus according to (13), in which the controller performs, in order, D-phase reading control that reads the voltage corresponding to the level of the charge held in the floating diffusion, reset control that resets the charge held in the floating diffusion, P-phase reading control that reads the voltage corresponding to the level of the charge held in the floating diffusion after the reset operation, and accumulation control that causes a charge generated from the incident light by the photoelectric transducer to accumulate in the floating diffusion.

(15)

A solid-state imaging apparatus including:

a photoelectric transducer that photoelectrically converts incident light;

a transfer transistor electrically coupled to the photoelectric transducer;

a floating diffusion that temporarily holds a charge outputted from the photoelectric transducer via the transfer transistor;

a reset transistor that resets a potential of the floating diffusion to a predetermined potential;

an amplifier transistor that generates a pixel signal having a voltage corresponding to a level of the charge held in the floating diffusion; and a selection transistor that controls an output timing of the pixel signal from amplifier transistor, in which the amplifier transistor has a WL area larger than a WL area of the transfer transistor.

(16)

The solid-state imaging apparatus according to (15), further including a controller that controls the transfer transistor, the reset transistor, the amplifier transistor, and the selection transistor in a global shutter mode.

(17)

The solid-state imaging apparatus according to (16), in which the controller performs, in order, D-phase reading control that reads the voltage corresponding to the level of the charge held in the floating diffusion, reset control that resets the charge held in the floating diffusion, P-phase reading control that reads the voltage corresponding to the level of the charge held in the floating diffusion after the reset operation, and accumulation control that causes a charge generated from the incident light by the photoelectric transducer to accumulate in the floating diffusion.

According to the first solid-state imaging apparatus of one embodiment of the present disclosure, the gate insulating film of the reset transistor is formed thinner than the gate insulating film of the transfer transistor. Therefore, it is possible to obtain image data having less kTC noises.

According to the second solid-state imaging apparatus of one embodiment of the present disclosure, the gate insulating film of the reset transistor is formed of an insulating material having a dielectric constant higher than that of the gate insulating film of the transfer transistor. Therefore, it is possible to obtain image data having less kTC noises.

According to the third solid-state imaging apparatus of one embodiment of the present disclosure, the L length of the reset transistor is shorter than the L length of the transfer transistor, and the W length of the reset transistor is longer than the W length of the transfer transistor. Therefore, it is possible to obtain image data having less kTC noises.

According to the fourth solid-state imaging apparatus of one embodiment of the present disclosure, the amplifier transistor and the selection transistor are formed of the PMOS transistors formed in the n-well layer surrounded by the p-well layer. Therefore, it is possible to obtain image data with less kTC noises.

According to the fifth solid-state imaging apparatus of one embodiment of the present disclosure, the WL area of the reset transistor is larger than the WL area of the transfer transistor. Therefore, it is possible to obtain image data with less kTC noises.

The present application claims priority based on Japanese Patent Application No. 2018-199328 filed with the Japan Patent Office on Oct. 23, 2018, the entire contents of which are incorporated herein by reference.

It should be understood that those skilled in the art would make various modifications, combinations, sub-combinations, and alterations depending on design requirements and other factors, and they are within the scope of the attached claims or the equivalents thereof.

The invention claimed is:

1. A solid-state imaging apparatus, comprising:
a photoelectric transducer configured to photoelectrically convert incident light into a first charge;
a transfer transistor electrically coupled to the photoelectric transducer;
a floating diffusion configured to temporarily hold the first charge, wherein
the first charge is outputted from the photoelectric transducer via the transfer transistor;
a reset transistor configured to reset a potential of the floating diffusion to a specific potential;
an amplifier transistor configured to generate a pixel signal having a voltage corresponding to a level of the first charge held in the floating diffusion; and
a selection transistor configured to control an output timing of the pixel signal from the amplifier transistor, wherein
the reset transistor includes a first gate insulating film thinner than a second gate insulating film of the transfer transistor; and
a controller configured to perform:
D-phase reading control that reads the voltage corresponding to the level of the first charge held in the floating diffusion,
reset control, after the D-phase reading control, that resets the first charge held in the floating diffusion,
P-phase reading control, after the reset control, that reads the voltage corresponding to the level of the first charge held in the floating diffusion, and
accumulation control, after the P-phase reading control, that causes a second charge to accumulate in the floating diffusion.

2. The solid-state imaging apparatus according to claim 1, wherein each of the amplifier transistor and the selection transistor includes a third gate insulating film thinner than the second gate insulating film of the transfer transistor.

3. The solid-state imaging apparatus according to claim 1, wherein the controller is further configured to control, in a global shutter mode, each of the transfer transistor, the reset transistor, the amplifier transistor, and the selection transistor.

4. A solid-state imaging apparatus, comprising:
a photoelectric transducer configured to photoelectrically convert incident light into a first charge;
a transfer transistor electrically coupled to the photoelectric transducer;
a floating diffusion configured to temporarily hold the first charge, wherein
the first charge is outputted from the photoelectric transducer via the transfer transistor;
a reset transistor configured to reset a potential of the floating diffusion to a specific potential;
an amplifier transistor configured to generate a pixel signal having a voltage corresponding to a level of the first charge held in the floating diffusion; and
a selection transistor configured to control an output timing of the pixel signal from the amplifier transistor, wherein
the reset transistor includes a first gate insulating film of a first insulating material having a dielectric constant higher than a dielectric constant of a second insulating material of a second gate insulating film of the transfer transistor.

5. The solid-state imaging apparatus according to claim 4, wherein each of the amplifier transistor and the selection transistor includes a third gate insulating film of a third insulating material having a dielectric constant higher that the dielectric constant of the second insulating material of the second gate insulating film of the transfer transistor.

6. The solid-state imaging apparatus according to claim 4, further comprising a controller configured to control, in a global shutter mode, each of the transfer transistor, the reset transistor, the amplifier transistor, and the selection transistor.

7. The solid-state imaging apparatus according to claim 6, wherein the controller is further configured to perform:
D-phase reading control that reads the voltage corresponding to the level of the first charge held in the floating diffusion,
reset control, after the D-phase reading control, that resets the first charge held in the floating diffusion,
P-phase reading control, after the reset control, that reads the voltage corresponding to the level of the first charge held in the floating diffusion, and
accumulation control, after the P-phase reading control, that causes a second charge to accumulate in the floating diffusion.

8. A solid-state imaging apparatus, comprising:
a photoelectric transducer configured to photoelectrically convert incident light into a first charge; a transfer transistor electrically coupled to the photoelectric transducer; a floating diffusion configured to temporarily hold the first charge, wherein the first charge is outputted from the photoelectric transducer via the transfer transistor; a reset transistor configured to reset a potential of the floating diffusion to a specific potential; an amplifier transistor configured to generate a pixel signal having a voltage corresponding to a level of the first charge held in the floating diffusion; a selection transistor configured to control an output timing of the pixel signal from the amplifier transistor, wherein the reset transistor has a horizontal length shorter than a horizontal length of the transfer transistor, and the reset transistor has a vertical length longer than a vertical length of the transfer transistor; and a controller configured to: control, in a global shutter mode, each of the transfer transistor, the reset transistor, the amplifier transistor, and the selection transistor; and perform: D-phase reading control that reads the voltage corresponding to the level of the first charge held in the floating diffusion,
reset control, after the D-phase reading control, that resets the first charge held in the floating diffusion, P-phase reading control, after the reset control, that reads the voltage corresponding to the level of the first charge held in the floating diffusion, and accumulation control, after the P-phase reading control, that causes a second charge to accumulate in the floating diffusion.

9. A solid-state imaging apparatus, comprising:
a photoelectric transducer configured to photoelectrically convert incident light into a first charge;
a transfer transistor electrically coupled to the photoelectric transducer;
a floating diffusion configured to temporarily hold the first charge, wherein
the first charge is outputted from the photoelectric transducer via the transfer transistor;
a reset transistor configured to reset a potential of the floating diffusion to a specific potential;
an amplifier transistor configured to generate a pixel signal having a voltage corresponding to a level of the first charge held in the floating diffusion;

a selection transistor configured to control an output timing of the pixel signal from the amplifier transistor, wherein
the amplifier transistor and the selection transistor are configured by PMOS transistors in an n-well layer surrounded by a p-well layer; and
a controller configured to perform:
D-phase reading control that reads the voltage corresponding to the level of the first charge held in the floating diffusion,
reset control, after the D-phase reading control, that resets the first charge held in the floating diffusion,
P-phase reading control, after the reset control, that reads the voltage corresponding to the level of the first charge held in the floating diffusion, and
accumulation control, after the P-phase reading control, that causes a second charge to accumulate in the floating diffusion.

10. The solid-state imaging apparatus according to claim 9, wherein the controller is further configured to control, in a global shutter mode, each of the transfer transistor, the reset transistor, the amplifier transistor, and the selection transistor.

11. A solid-state imaging apparatus, comprising:
a photoelectric transducer configured to photoelectrically convert incident light into a first charge; a transfer transistor electrically coupled to the photoelectric transducer;
a floating diffusion configured to temporarily hold the first charge, wherein
the first charge is outputted from the photoelectric transducer via the transfer transistor;
a reset transistor configured to reset a potential of the floating diffusion to a specific potential; an amplifier transistor configured to generate a pixel signal having a voltage corresponding to a level of the first charge held in the floating diffusion;
a selection transistor configured to control an output timing of the pixel signal from the amplifier transistor, wherein the amplifier transistor has an area larger than an area of the transfer transistor; and a controller configured to :control, in a global shutter mode, each of the transfer transistor, the reset transistor, the amplifier transistor, and the selection transistor; and perform: D-phase reading control that reads the voltage corresponding to the level of the first charge held in the floating diffusion, reset control, after the D-phase reading control, that resets the first charge held in the floating diffusion, P-phase reading control, after the reset control, that reads the voltage corresponding to the level of the first charge held in the floating diffusion, and accumulation control, after the P-phase reading control, that causes a second charge to accumulate in the floating diffusion.

* * * * *